US010146899B1

(12) United States Patent
Folberth et al.

(10) Patent No.: US 10,146,899 B1
(45) Date of Patent: Dec. 4, 2018

(54) CLOCK CONTROL TREES

(71) Applicant: INTERNATIONAL BUSINESS MACHINES CORPORATION, Armonk, NY (US)

(72) Inventors: Harald Folberth, Boeblingen (DE); Sven Nitzsche, Karlsruhe (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/823,068

(22) Filed: Nov. 27, 2017

(51) Int. Cl.
G11C 5/08 (2006.01)
G06F 17/50 (2006.01)
H03L 7/04 (2006.01)

(52) U.S. Cl.
CPC ........ G06F 17/505 (2013.01); G06F 17/5022 (2013.01); G06F 17/5072 (2013.01); H03L 7/04 (2013.01); G06F 17/5077 (2013.01); G06F 2217/62 (2013.01)

(58) Field of Classification Search
CPC ............... G06F 17/505; G06F 17/5022; G06F 17/5072; G06F 17/5077; G06F 2217/62
See application file for complete search history.

(56) References Cited

U.S. PATENT DOCUMENTS

| 8,356,264 | B2* | 1/2013 | Lasher | G06F 17/5077 703/16 |
| 8,966,425 | B1* | 2/2015 | Eisenstadt | G06F 17/5077 716/120 |
| 9,280,628 | B2 | 3/2016 | Walker et al. | |
| 9,477,258 | B2* | 10/2016 | Nieh | G06F 1/10 |
| 2008/0074147 | A1 | 3/2008 | Cohn et al. | |
| 2016/0300546 | A1* | 10/2016 | Zheng | G09G 3/20 |

FOREIGN PATENT DOCUMENTS

JP 2011238011 A 11/2011

OTHER PUBLICATIONS

Saha et al., "Obstacle Avoiding Delay Equalization for Rectilinear Clock Tree Routing Based on a Game Theoretic Approach", International Journal of Engineering and Innovative Technology (IJEIT), vol. 3, Issue 4, Oct. 2013, 9 pages.

* cited by examiner

Primary Examiner — Pho M Luu
(74) Attorney, Agent, or Firm — Tihon Poltavets

(57) ABSTRACT

A method includes identifying a design area for a microelectronic device, where the design area includes a plurality of sub-units, each sub-unit from the plurality of sub-units capable of receiving a control signal. The method places a central latch in a center of the design area, where the central latch presents a connection point on a first level of the design area. Responsive to determining a sub-unit of the plurality of sub-units does not include a latch, the method creates a horizontal and vertical axis through the central latch, where the horizontal and vertical axis are bound by a perimeter of the design area. The method places a first set of latches for tiles created by the horizontal axis and the vertical axis on a second level of the design area, where each latch of the first set of latches is placed in a center of a single tile.

20 Claims, 6 Drawing Sheets

CLOCK CONTROL TREES

FIELD OF INVENTION

This disclosure relates generally to clock control trees, and in particular to creating clock control trees within an abutted hierarchical design environment.

BACKGROUND OF THE INVENTION

Most integrated circuits (ICs) of sufficient complexity utilize a clock signal in order to synchronize different parts of the circuits. Typically, delivering a clock signal to different areas of the chip requires a metal grid, which provides a low amount of skew. A clock distribution network (i.e., clock tree) distributes the clock signal or signals from a common point to all elements of that chip that require it. Since function is vital to the operation of a synchronous system, special attention is typically directed to characteristics of these clock signals and the electrical networks used in the distribution of these clock signals. Presently, distances are manually measured between each control clock tree source and respective sink, where a tree is individually created based on reach-tables. Reach-tables include maximum distances for which a given repower circuit can drive on a specific wire-plane with respectively selected wire-code. Subsequently, the respective control clock tree sub-stage or sub-stages are logically implemented by hand with respective Very High Speed Integrated Circuits (VHSIC) Hardware Description Language (VHDL) code snippets.

SUMMARY

Embodiments in accordance with the present invention disclose a method, computer program product and computer system for creating clock trees. The present invention identifies a design area for a microelectronic device, wherein the design area includes a plurality of sub-units, each sub-unit from the plurality of sub-units capable of receiving a control signal. The present invention places a central latch in a center of the design area, wherein the central latch presents a connection point on a first level of the design area for receiving the control signal. Responsive to determining a sub-unit of the plurality of sub-units does not include a latch, the present invention creates a horizontal axis and a vertical axis through the central latch, wherein the horizontal axis and the vertical axis are bound by a perimeter of the design area. The present invention places a first set of latches for tiles created by the horizontal axis and the vertical axis on a second level of the design area, wherein each latch of the first set of latches is placed in a center of a single tile.

DETAILED DESCRIPTION

Embodiments of the present invention are directed to an electronic model for creating equally staged control clock trees within an abutted hierarchical design environment during a design phase of a microelectronic device, prior to fabrication of the microelectronic device. Very-large-scale integration (VLSI) circuits combine thousands of transistors into a microelectronic device, where a clock distribution network (i.e., clock tree) is required to distribute clock signals from a single point to all elements requiring clock signals on the microelectronic device. As microelectronic devices and components (i.e., elements) on the microelectronic devices decrease in size, the complexity in manually creating clocking tree increases. Embodiments of the present invention allow for the automated creation of a clock distribution network on a microelectronic device by dividing the abutted hierarchical design area into quadrisections and placing a single stage into a center of each quadrisection. Through multiple iterations of creating quadrisections and placing stages into the center of each quadrisection, embodiments of the present invention allow for equal clock stages to all elements of the clock distribution network.

Figure 1:
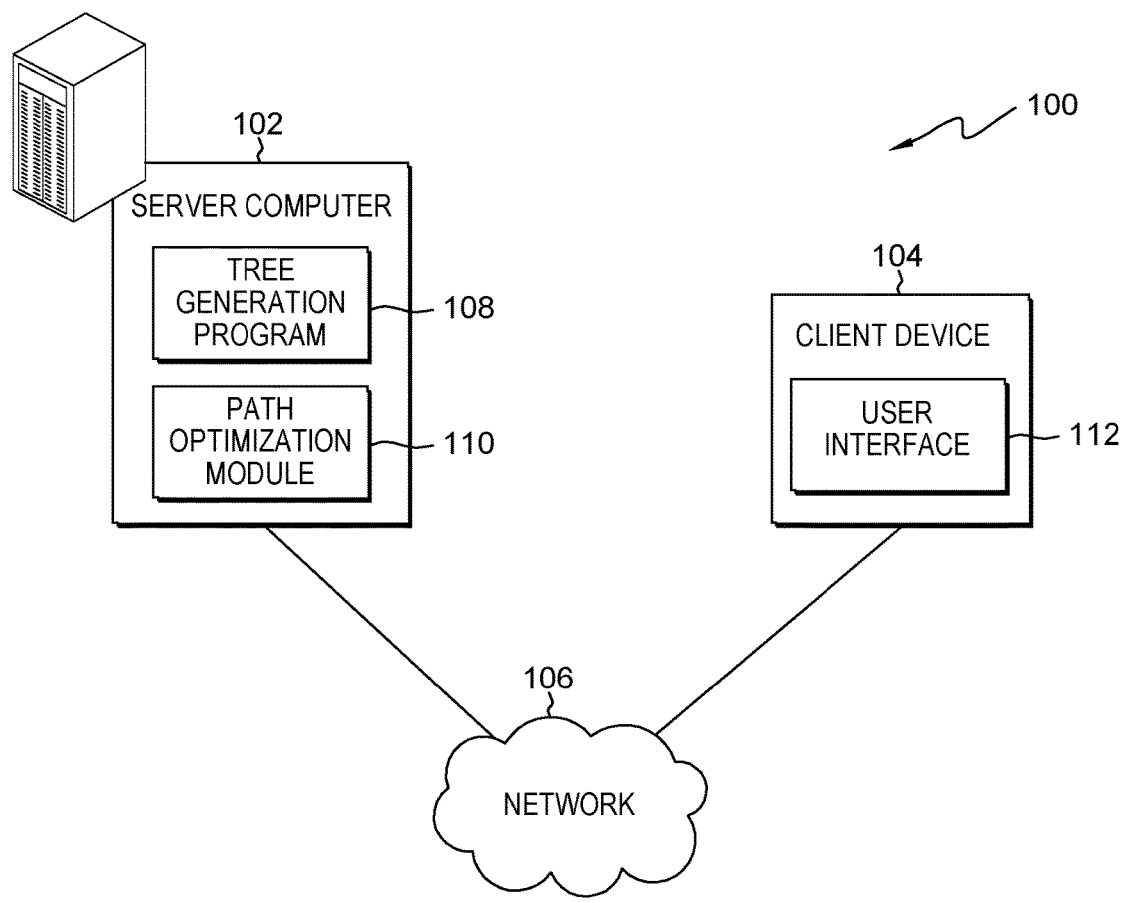
FIG. 1 is a functional block diagram illustrating a distributed data processing environment, in accordance with an embodiment of the present invention.

FIG. 1 is a functional block diagram illustrating a distributed data processing environment, in accordance with one embodiment of the present invention. The distributed data processing environment includes server computer 102 and client device 104, all interconnected over network 106.

Server computer 102 may be a desktop computer, a laptop computer, a tablet computer, a specialized computer server, a smartphone, or any other computer system known in the art. In certain embodiments, server computer 102 represents a computer system utilizing clustered computers and components that act as a single pool of seamless resources when accessed through network 106, as is common in data centers and with cloud computing applications. In general, server computer 102 is representative of any programmable electronic device or combination of programmable electronic devices capable of executing machine-readable program instructions and communicating with other computer devices via a network. In this embodiment, server computer 102 has the ability to communicate with other computer devices to query the computer devices for information. Server computer 102 includes tree generation program 108 and path optimization module 110.

Client device 104 may be a laptop computer, tablet computer, netbook computer, personal computer (PC), personal digital assistant (PDA), smart phone, wearable device (e.g., smart watch, personal fitness device, personal safety device), or any programmable computer system known in the art with an interactive display. Client device 104 includes user interface 112 and may include a client side tree generation program 108, not illustrated in FIG. 1. In general, client device 104 is representative of any programmable electronic device or combination of programmable electronic devices capable of executing machine-readable program instructions and communicating with users of other electronic devices via network 106. Client device 104 may include components, as depicted and described in further detail with respect to FIG. 8, in accordance with embodiments of the present invention.

Tree generation program 108 can identify a center of a design area, where the design area is a microelectronic device in a development stage. The design area can be of any defined shape (e.g., quadrilateral) or any irregular shape with a combination of straight and curved edges. Tree generation program 108 places a latch in the identified center of the design area, where the latch represents a base point from which tree generation program 108 generates a clock tree for the design area. Tree generation program 108 determines whether a sub-unit of the design area does not include a latch and responsive to determining a sub-unit does not include a latch, tree generation program 108 creates a horizontal axis (x-axis) and a vertical axis (y-axis) through each existing latch. Each of the horizontal axis and the vertical axis is bound by an outer edge of the design area, where the outer edge presents a perimeter of the design area. Tree generation program 108 creates a latch in a center of each tile created by the bounds of the outer edge of the design area and the created horizontal axis and vertical axis. If tree generation program 108 determines that all sub-units include a latch, tree generation program 108 removes any unnecessary latches and performs placement correction for remaining latches utilizing placement optimization module 110. Placement optimization module 110 minimizes sub-unit border crossings and rectilinear distance between every latch in the design area. Tree generation program 108 creates and stores a tree path for the design area based on remaining latches.

In general, network 106 can be any combination of connections and protocols that will support communications between server computer 102 and client device 104. Network 106 can include, for example, a local area network (LAN), a wide area network (WAN), such as the internet, a cellular network, or any combination of the preceding, and can further include wired, wireless, and/or fiber optic connections. In one embodiment, tree generation program 108 and path optimization module 110 can be a web service accessible via network 106 to a user of client device 104. In another embodiment, tree generation program 108 and path optimization module 110 may be operated directly by a user of server computer 102.

Client device 104 also includes user interface (UI) 112 and various programs (not shown). Examples of the various programs on client device 104 include: a web browser, an e-mail client, security software (e.g., a firewall program, a geo-locating program, an encryption program, etc.), an instant messaging (IM) application (app), and a communication (e.g., phone) application. In an example, a user of client device 104 can interact with user interface 112, such as a touch screen (e.g., display) that performs both input to a graphical user interface (GUI) and as an output device (e.g., a display) presenting a plurality of icons associated with software applications or images depicting the executing software application. Optionally, a software application (e.g., a web browser) can generate user interface 112 operating within the GUI of client device 104. User interface 112 accepts input from a plurality of input/output (I/O) devices including, but not limited to, a tactile sensor interface (e.g., a touch screen, a touchpad) referred to as a multi-touch display. An I/O device interfacing with user interface 112 may be connected to client device 104, which may operate utilizing wired (e.g., USB port) or wireless network communications (e.g., infrared, NFC, etc.).

Figure 2:
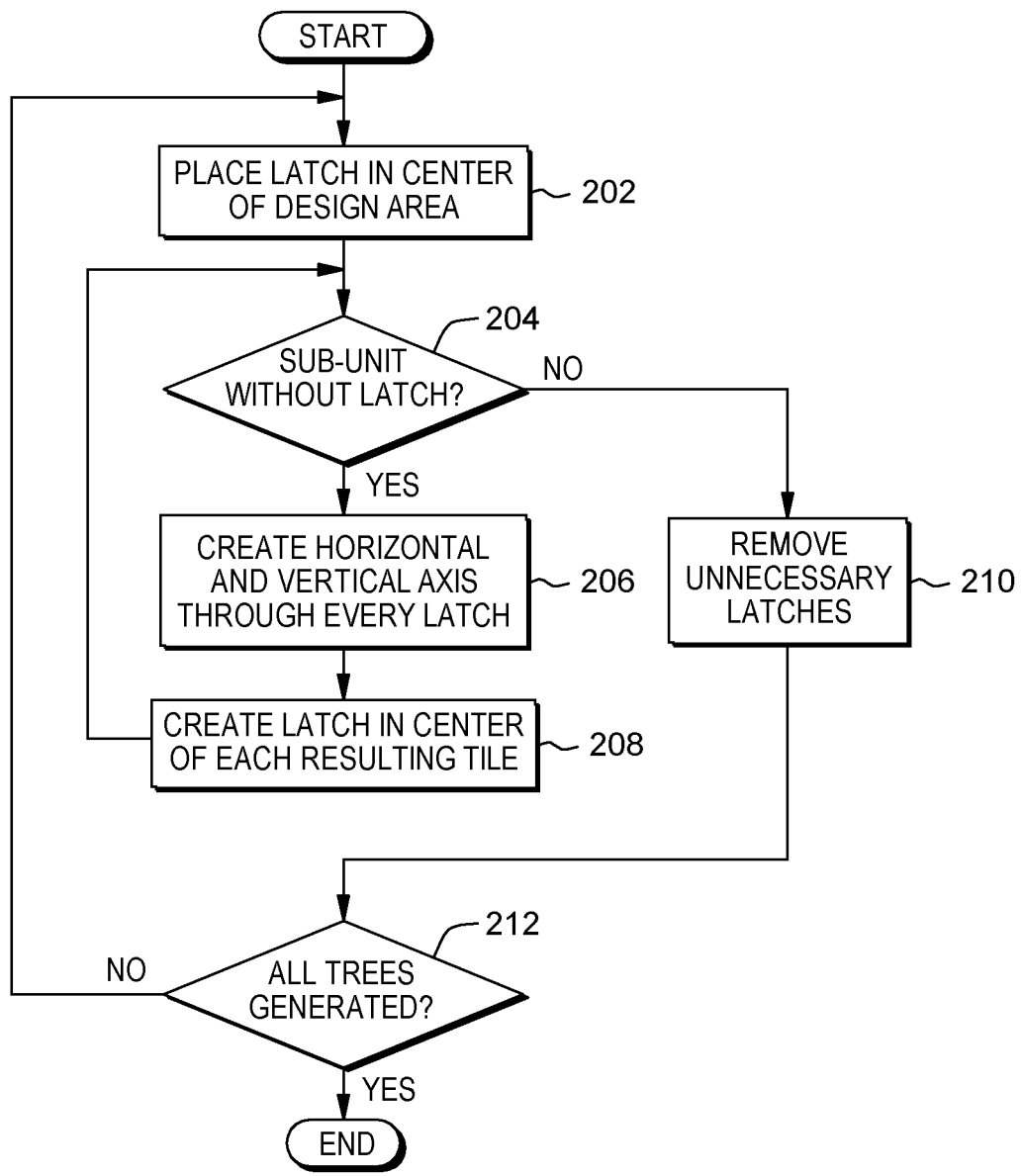
FIG. 2 is a flowchart depicting operational steps of a tree generation program, in accordance with an embodiment of the present invention.

FIG. 2 is a flowchart depicting operational steps of a tree generation program, in accordance with an embodiment of the present invention.

Tree generation program 108 places a latch in the center of the design area (202). In this embodiment, tree generation program 108 places a latch in the center of a design area (e.g., processor), where the design area is rectangular in shape. Tree generation program 108 identifies the center of the design area by equally dividing measured distances for a length and a width of the design area. Upon identifying the center of the design area, tree generation program 108 places the latch in the center of the design area. A latch presents a point on the design area to which tree generation program 108 creates a connection to propagate a control signal (i.e., clock signal). The latch in the center of the design area represents a base point from which tree generation program 108 creates an initial quadrisection for the design area.

In another embodiment, tree generation program 108 places a latch in the center of a design area, where the design area is an irregular shape. Tree generation program 108 identifies the center of the design area by initially creating line segments perpendicular to an edge of the design area, spaced at predetermined distances. Tree generation program 108 creates the perpendicular lines spaced at the predetermined distance for the circumference of the design area. Subsequently, tree generation program 108 identifies a point where a greatest number of the created line segments intersect and tree generation program 108 places the latch at that identified point. The latch where the greatest number of the created line segments intersect represents the center of the design area and the point from which tree generation program 108 creates an initial quadrisection for the design area. In yet another embodiment, tree generation program 108 can identify a gray area of the design area, where the gray area of the design area does not require electrical connection. As a result, tree generation program 108 can exclude the gray area when identifying a center for the design area, thus shifting (i.e., skewing) the location where tree generation program 108 places the latch.

Tree generation program 108 determines whether a sub-unit exists without a latch (decision 204). A sub-unit of the design area represents a portion of the design area that includes a component that requires a connection for the propagation of a control signal (i.e., clock signal). In the event tree generation program 108 determines a sub-unit exists without a latch ("yes" branch, decision 204), tree generation program 108 creates a horizontal and vertical axis through every latch (206). In the event tree generation program 108 determines a sub-unit does not exist without a latch ("no" branch, decision 204), tree generation program 108 removes unnecessary latches (210).

Tree generation program 108 creates a horizontal and vertical axis through every latch (206). By creating a horizontal axis perpendicular to a vertical axis through every latch, tree generation program 108 creates a single quadrisection. Each latch represents the center of the quadrisection created by the horizontal axis and the vertical axis, where the horizontal axis and the vertical axis each have two end points on the edges of the design area. The edges (i.e., perimeter) of the design area act as the boundary for any horizontal axis and vertical axis that tree generation program 108 creates. In one embodiment, the design area is a square, where tree generation program 108 created a latch in the center of the design area. Tree generation program 108 creates a horizontal axis and a vertical axis through the created latch in the center of the design, resulting in the creation of 4 tiles (i.e., quadrisections) that are equal in area. In another embodiment, the design area is irregularly shaped, where tree generation program 108 created a latch in the center of the design area. Tree generation program 108 creates a horizontal axis and a vertical axis through the created latch in the center of the design area. However, due to the irregular shape of the design area, the resulting quadrisection that tree generation program 108 creates includes four tiles that vary in dimension. For example, section (X, Y) is a greater area than section (-X, Y), where section (-X, -Y) and section (X, -Y) are each greater than section (X, Y).

Tree generation program 108 creates a latch in the center of each resulting tile (208). In one embodiment, the design area is a square, where the horizontal axis and the vertical axis created a quadrisection with four tiles of equal area. Tree generation program 108 identifies the center of each tile by equally dividing measured distances for a length and a width of a tile. Upon identifying the center of the tile, tree generation program 108 places the latch in the center of the tile and repeats the process for each resulting tile. In another embodiment, the design area is an irregular shape, where the horizontal axis and the vertical axes created a quadrisection with four tiles of varying area. Tree generation program 108 identifies the center of each tile by initially extending the horizontal axis and the vertical axis beyond the edge (i.e., bounds) of the design area to form a quadrilateral. Upon creation of the quadrilateral, tree generation program 108 determines a center of the resulting tile and creates a latch in the center of the resulting tile. The latch that tree generation program 108 creates, may not necessarily be placed within the bounds of the design area. Tree generation program 108 reverts back to determining whether a sub-unit exists without a latch (decision 204)

Tree generation program 108 removes unnecessary latches (210). Tree generation program 108 identifies each latch that was created outside the bounds of the design area, where each latch that was created outside the bounds of the design area represents an unnecessary latch. Tree generation program 108 removes each identified latch that was created outside the design area. In this embodiment, tree generation program 108 further reduces a number of unnecessary latches for the design area by identifying a number of times that tree generation program created horizontal and vertical axis through each latch (206). The identified number of times that tree generation program 108 created horizontal and vertical axis through each latch (e.g. three times) is equal to the number of levels of latches (e.g., three levels). For example, a first level includes a single latch, a second level includes four latches, and a third level includes sixteen latches. Tree generation program 108 identifies a single latch in each sub-unit through which a control signal can pass to the sub-unit, where each identified latch was created on the same level (i.e., third level). Tree generation program 108 identifies any remaining latches, that were not identified, as unnecessary and removes the latches from the design area. Subsequently, tree generation program 108 connects all remaining latches across all levels of the design tree (i.e., tree generation).

In one embodiment, tree generation program 108 utilizes path optimization module 110 to relocate the single latch in each sub-unit as part of a placement correction. The placement correction allows for optimal placement with respect to latches located on different level of the design area, where optimal placement refers to minimum sub-unit crossing and rectilinear distance. Alternatively, placement correction algorithms of path optimization module 110 are incorporated into tree generation program 108. In another embodiment, tree generation program 108 identifies a single latch for each sub-unit (e.g., third level) based on a location with respect to a latch on a previous level (e.g., second level). For example, tree generation program 108 selects the single latch for each sub-unit on the third level that is closest to the single latch on the second level. Subsequently, tree generation program 108 connects all remaining latches after the optimization across all levels of the design tree (i.e., tree generation).

Tree generation program 108 determines whether all trees are generated (decision 212). In the event, tree generation program 108 determines that all trees have been generated ("yes" branch, decision 212), tree generation program 108 ceases operations and stores the generated trees for the design area. Tree generation program 108 can store multiple versions of the design area, where the multiple versions include the design area with the identified latches, the design area with the identified latches with corrective placement, the design area with the identified latches and the created path, and the design area with the identified latches and the created path with corrective placement. In the event, tree generation program 108 determines that all trees have not been generated ("no" branch, decision 212), tree generation program 108 reverts to placing a latch in the center of the design area (202).

Figure 3:
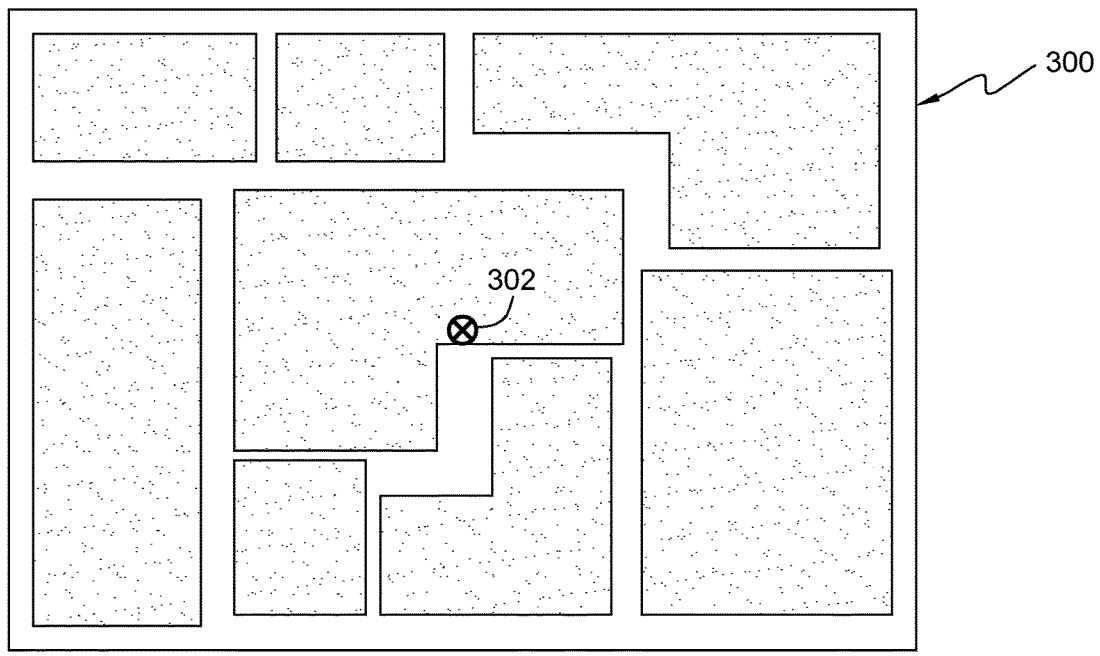
FIG. 3 illustrates a design area with multiple sub-units and a marked central latch, in accordance with an embodiment of the present invention.

FIG. 3 illustrates a design area with multiple sub-units and a marked central latch, in accordance with an embodiment of the present invention.

In this embodiment, design area 300 is rectangular in shape, where design area 300 includes eight sub-units. Tree generation program 108 identifies the center of design area 300 by equally dividing measured distances for a length and a width of design area 300. Upon identifying the center of design area 300, tree generation program 108 places central latch 302 in the center of design area 300. Central latch 302 presents a point on the design area to which tree generation program 108 creates a connection to propagate a control signal (i.e., clock signal). Additionally, central latch 302 represents a first level of design area 300 and a base point from which tree generation program 108 creates an initial quadrisection for design area 300.

Figure 4:
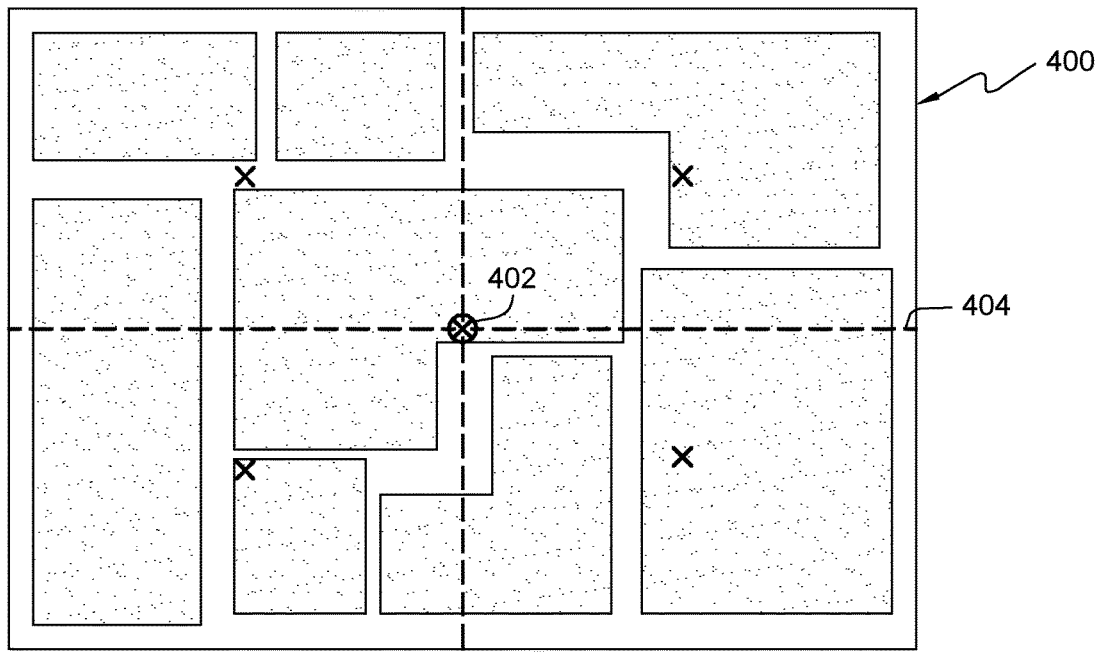
FIG. 4 illustrates a design area with multiple sub-units and a first marked quadrisection with latches, in accordance with an embodiment of the present invention.

FIG. 4 illustrates a design area with multiple sub-units and a first marked quadrisection with latches, in accordance with an embodiment of the present invention.

In this embodiment, tree generation program 108 determines a sub-unit exists in design area 400 without a latch and creates a horizontal and vertical axis through central latch 402. By creating a horizontal axis perpendicular to a vertical axis through every latch, tree generation program 108 creates quadrisection 404. Central latch 402 represents the center of quadrisection 404 created by the horizontal axis and the vertical axis, where the horizontal axis and the vertical axis each have two end points on the edges of design area 400. The edges of design area 400 act as the boundary for the horizontal axis and the vertical axis that tree generation program 108 creates. Quadrisection 404 results in four tiles that cover design area 400, where tree generation program 108 creates a latch in a center of each tile of the resulting four tiles. The resulting four latches created in the resulting four tiles represent a second level of design area 400.

Figure 5:
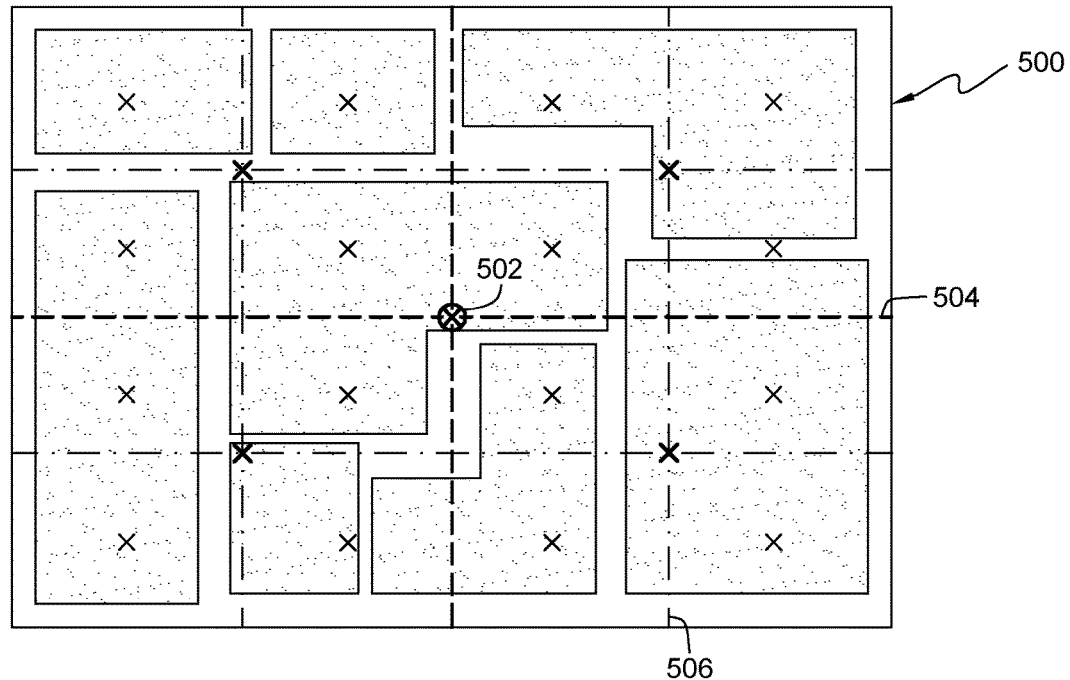
FIG. 5 illustrates a design area with multiple sub-units and a second marked quadrisection with latches, in accordance with an embodiment of the present invention.

FIG. 5 illustrates a design area with multiple sub-units and a second marked quadrisection with latches, in accordance with an embodiment of the present invention.

In this embodiment, tree generation program 108 determines a sub-unit still exists in design area 500 without a latch and creates a horizontal and vertical axis through each of the four latches previously discuss in FIG. 4. By creating a horizontal axis perpendicular to a vertical axis through every latch, tree generation program 108 creates four separate quadrisections 506, in addition to the original quadrisection 504 that tree generation program 108 created through central latch 502. Each of the four latches represents the center of each of the four quadrisections 506 created by the horizontal axis and the vertical axis, where each set of the horizontal axis and the vertical axis each have two end points on the edges of design area 500. Quadrisection 504 and quadrisections 506 results in a total of sixteen tiles that cover design area 500, where tree generation program 108 creates a latch in a center of each tile of the resulting sixteen tiles. The resulting sixteen latches created in the resulting sixteen tiles represent a third level of design area 500. In total, tree generation program 108 has created twenty-one tiles across the first level, the second level, and the third level of design area 500.

Figure 6:
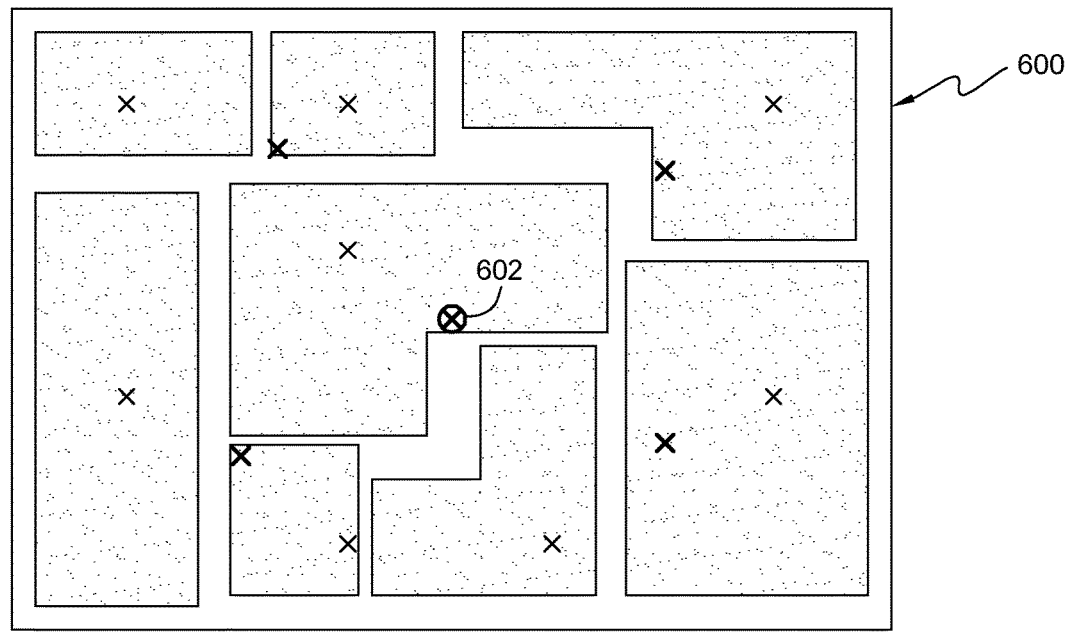
FIG. 6 illustrates a design area with multiple sub-units with removed latches and corrective placement, in accordance with an embodiment of the present invention.

FIG. 6 illustrates a design area with multiple sub-units with removed latches and corrective placement, in accordance with an embodiment of the present invention.

In this embodiment, tree generation program 108 reduces a number of unnecessary latches for design area 600 by identifying a number of levels of latches (i.e., three levels) for design area 600. In this example, a first level includes a single latch, a second level includes four latches, and a third level includes sixteen latches. Tree generation program 108 identifies a single latch in each sub-unit through which a control signal (i.e., clock signal) can pass to the sub-unit, where each identified latch was created on the same level (i.e., third level). Tree generation program 108 identifies any remaining latches as unnecessary and removes the latches from design area 600. In this example, there are eight sub-units and tree generation program 108 removes eight latches out of the sixteen latches on the third level. As a result, the first level includes a single latch, the second level includes four latches, and the third level has eight latches, for a total of thirteen latches for design area 600. In this example, tree generation program 108 relocates a portion of the thirteen latches as part of a placement correction. The placement correction allows for optimal placement with respect to latches located on different level of the design area. Subsequently, tree generation program 108 connects all remaining latches across all levels of the design tree (i.e., tree generation).

Figure 7:
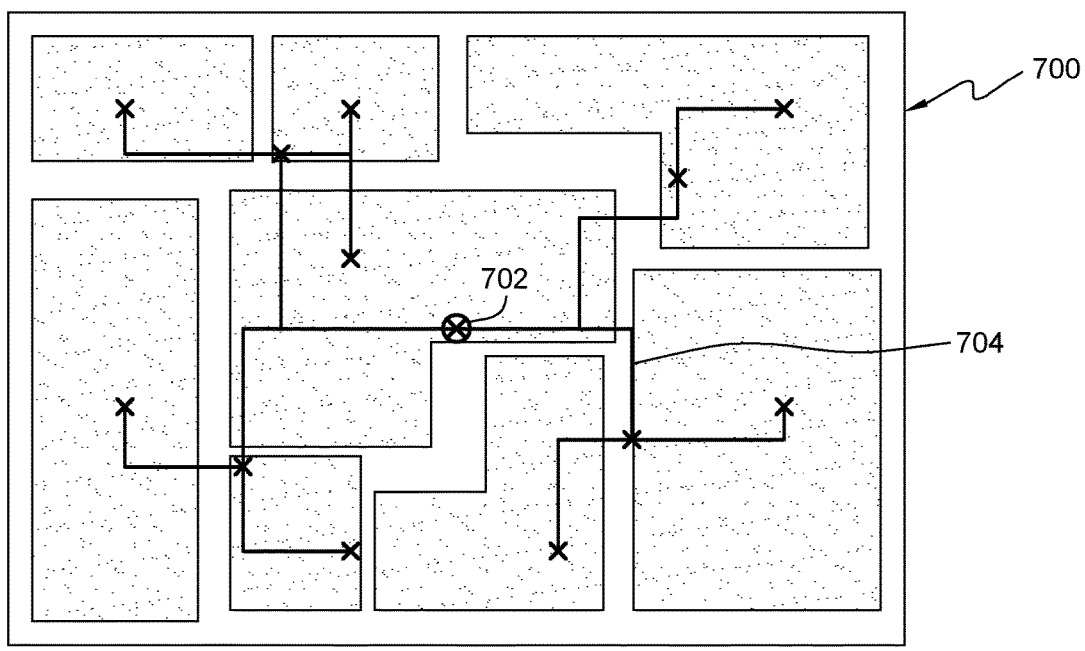
FIG. 7 illustrates a design area with multiple sub-units and a tree path with corrective placement, in accordance with an embodiment of the present invention.

FIG. 7 illustrates a design area with multiple sub-units and a tree path with corrective placement, in accordance with an embodiment of the present invention.

In this example, tree generation program 108 connects the thirteen latches across all levels of the design tree (i.e., tree generation) for design area 700. For the third level, tree generation program 108 connects each of the eight latches to at least one of the four latches on the second level. For the second level, tree generation program 108 connects each of the four latches to central latch 702 on the first level. The connections across the first level, the second level, and the third level creates tree map 704. Tree generation program 108 stores multiple versions of design area 700, where the multiple versions include design area 700 with the identified latches, design area 700 with the identified latches with corrective placement, design area 700 with the identified latches and the created tree map 704, and the design area with the identified latches and the created tree map 704 with corrective placement.

Figure 8:
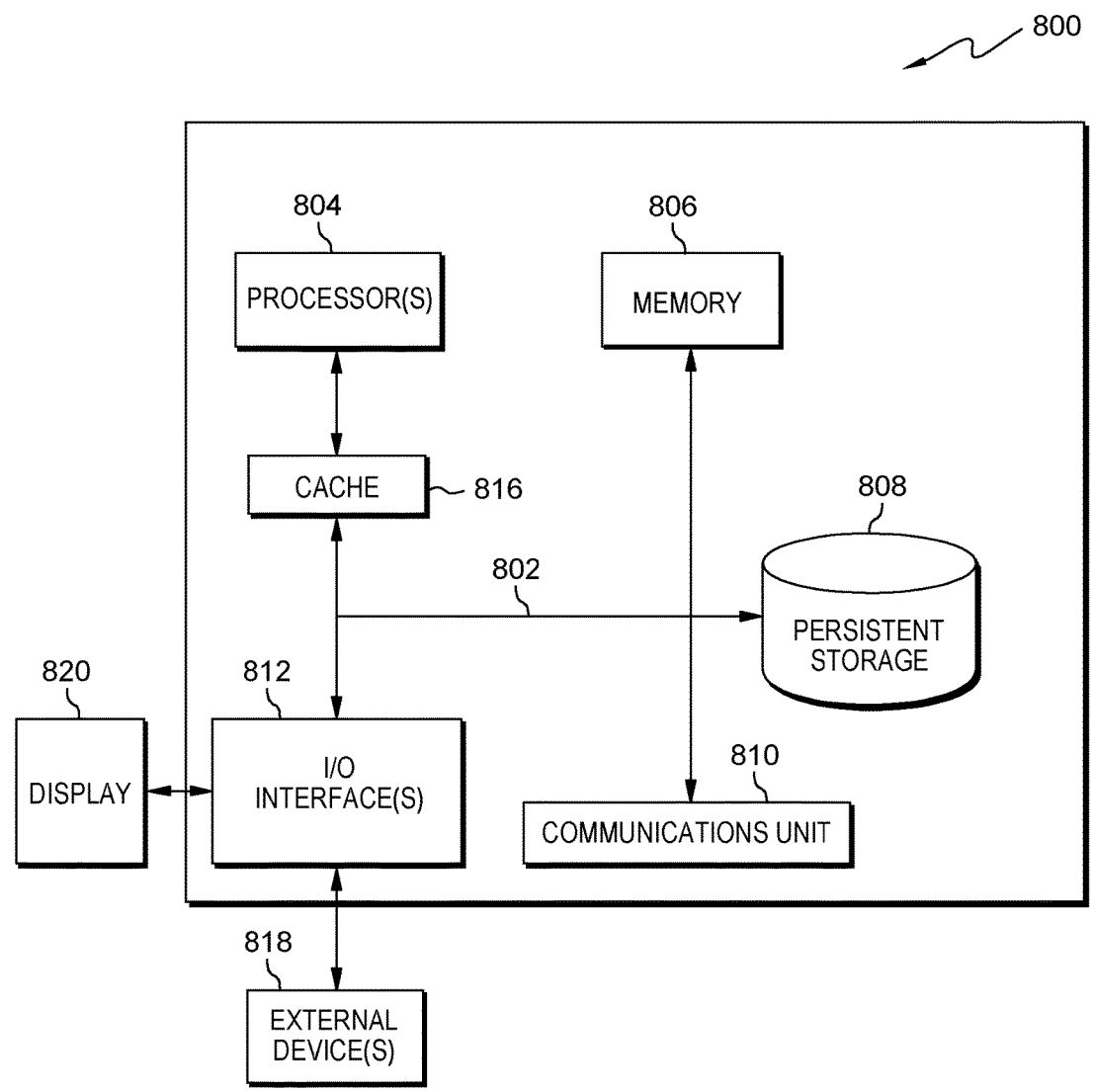
FIG. 8 is a block diagram of components of a computer system, such as the server computer of FIG. 1, in accordance with an embodiment of the present invention.

FIG. 8 depicts computer system 800, where server computer 102 is an example of a system that includes tree generation program 108 and path optimization module 110. The computer system includes processors 804, cache 816, memory 806, persistent storage 808, communications unit 810, input/output (I/O) interface(s) 812 and communications fabric 802. Communications fabric 802 provides communications between cache 816, memory 806, persistent storage 808, communications unit 810, and input/output (I/O) interface(s) 812. Communications fabric 802 can be implemented with any architecture designed for passing data and/or control information between processors (such as microprocessors, communications and network processors, etc.), system memory, peripheral devices, and any other hardware components within a system. For example, communications fabric 802 can be implemented with one or more buses or a crossbar switch.

Memory 806 and persistent storage 808 are computer readable storage media. In this embodiment, memory 802 includes random access memory (RAM). In general, memory 806 can include any suitable volatile or non-volatile computer readable storage media. Cache 816 is a fast memory that enhances the performance of processors 804 by holding recently accessed data, and data near recently accessed data, from memory 806.

Program instructions and data used to practice embodiments of the present invention may be stored in persistent storage 808 and in memory 806 for execution by one or more of the respective processors 804 via cache 816. In an embodiment, persistent storage 808 includes a magnetic hard disk drive. Alternatively, or in addition to a magnetic hard disk drive, persistent storage 808 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 808 may also be removable. For example, a removable hard drive may be used for persistent storage 808. Other examples include optical and magnetic disks, thumb drives, and smart cards that are inserted into a drive for transfer onto another computer readable storage medium that is also part of persistent storage 808.

Communications unit 810, in these examples, provides for communications with other data processing systems or devices. In these examples, communications unit 810 includes one or more network interface cards. Communications unit 810 may provide communications through the use of either or both physical and wireless communications links. Program instructions and data used to practice embodiments of the present invention may be downloaded to persistent storage 808 through communications unit 810.

I/O interface(s) 812 allows for input and output of data with other devices that may be connected to each computer system. For example, I/O interface 806 may provide a connection to external devices 818 such as a keyboard, keypad, a touch screen, and/or some other suitable input device. External devices 818 can also include portable computer readable storage media such as, for example, thumb drives, portable optical or magnetic disks, and memory cards. Software and data used to practice embodiments of the present invention can be stored on such portable computer readable storage media and can be loaded onto persistent storage 808 via I/O interface(s) 812. I/O interface(s) 812 also connect to display 820.

Display 820 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
   identifying, by one or more processors, a design area for a microelectronic device, wherein the design area includes a plurality of sub-units, each sub-unit from the plurality of sub-units capable of receiving a control signal;
   placing, by one or more processors, a central latch in a center of the design area, wherein the central latch presents a connection point on a first level of the design area for receiving the control signal;
   responsive to determining that a sub-unit of the plurality of sub-units does not include a latch, creating, by one or more processors, a horizontal axis and a vertical axis through the central latch, wherein the horizontal axis and the vertical axis are bound by a perimeter of the design area; and
   placing, by one or more processors, a first set of latches for tiles created by the horizontal axis and the vertical axis on a second level of the design area, wherein each latch of the first set of latches is placed in a center of a single tile.

2. The method of claim 1, further comprising:
   subsequent to placement of the first set of latches, determining, by one or more processors, whether each sub-unit of the plurality of sub-units includes a latch;
   responsive to determining that each sub-unit of the plurality of sub-units includes a latch, identifying, by one or more processors, an unnecessary latch in the design area, wherein the unnecessary latch is selected from a group comprising of: a latch outside the bounds of the design area or a duplicate latch of a sub-unit from the plurality of sub-units.

3. The method of claim 2, further comprising:
   removing, by one or more processors, the unnecessary latch from the design area; and
   relocating, by one or more processors, a first latch out of the first set of latches, wherein relocating the first latch decreases a border crossing amount between the plurality of sub-units.

4. The method of claim 3, further comprising:
   creating, by one or more processors, a tree map for the central latch and the first set of latches, wherein the tree map is an electrical connection between each latch of the first set of latches of the second level and the central latch of the first level.

5. The method of claim 2, further comprising:
   removing, by one or more processors, the unnecessary latch from the design area; and
   relocating, by one or more processors, a first latch out of the first set of latches, wherein relocating the first latch decreases a rectilinear distance between the first latch and the central latch.

6. The method of claim 5, further comprising:
   creating, by one or more processors, a tree map for the central latch and the first set of latches, wherein the tree map is an electrical connection between each latch of the first set of latches of the second level and the central latch of the first level.

7. The method of claim 5, further comprising:
   storing, by one or more processors, the design area with the central latch, the first set of latches, and the tree map.

8. A computer program product comprising:
   one or more computer readable storage media and program instructions stored on at least one of the one or more storage media, the program instructions comprising:
   program instructions to identify a design area for a microelectronic device, wherein the design area includes a plurality of sub-units, each sub-unit from the plurality of sub-units capable of receiving a control signal;
   program instructions to place a central latch in a center of the design area, wherein the central latch presents a connection point on a first level of the design area for receiving the control signal;
   program instructions to, responsive to determining that a sub-unit of the plurality of sub-units does not include a latch, create a horizontal axis and a vertical axis through the central latch, wherein the horizontal axis and the vertical axis are bound by a perimeter of the design area; and
   program instructions to place a first set of latches for tiles created by the horizontal axis and the vertical axis on a second level of the design area, wherein each latch of the first set of latches is placed in a center of a single tile.

9. The computer program product of claim 8, further comprising program instructions, stored on the one or more computer readable storage media, which when executed by a processor, cause the processor to:
   subsequent to placement of the first set of latches, determine whether each sub-unit of the plurality of sub-units includes a latch;
   responsive to determining that each sub-unit of the plurality of sub-units includes a latch, identify an unnecessary latch in the design area, wherein the unnecessary latch is selected from a group comprising of: a latch outside the bounds of the design area or a duplicate latch of a sub-unit from the plurality of sub-units.

10. The computer program product of claim 9, further comprising program instructions, stored on the one or more computer readable storage media, which when executed by a processor, cause the processor to:
    remove the unnecessary latch from the design area; and
    relocate a first latch out of the first set of latches, wherein relocating the first latch decreases a rectilinear distance between the first latch and the central latch.

11. The computer program product of claim 10, further comprising program instructions, stored on the one or more computer readable storage media, which when executed by a processor, cause the processor to:
    create a tree map for the central latch and the first set of latches, wherein the tree map is an electrical connection between each latch of the first set of latches of the second level and the central latch of the first level.

12. The computer program product of claim 10, further comprising program instructions, stored on the one or more computer readable storage media, which when executed by a processor, cause the processor to:
    store the design area with the central latch, the first set of latches, and the tree map.

13. The computer program product claim 9, further comprising program instructions, stored on the one or more computer readable storage media, which when executed by a processor, cause the processor to:
    remove the unnecessary latch from the design area; and
    relocate a first latch out of the first set of latches, wherein relocating the first latch decreases a border crossing amount between the plurality of sub-units.

14. The computer program product of claim 13, further comprising program instructions, stored on the one or more computer readable storage media, which when executed by a processor, cause the processor to:

create a tree map for the central latch and the first set of latches, wherein the tree map is an electrical connection between each latch of the first set of latches of the second level and the central latch of the first level.

15. A computer system comprising:

one or more computer processors;

one or more computer readable storage media; and program instructions stored on the computer readable storage media for execution by at least one of the one or more computer processors, the program instructions comprising:

program instructions to identify a design area for a microelectronic device, wherein the design area includes a plurality of sub-units, each sub-unit from the plurality of sub-units capable of receiving a control signal;

program instructions to place a central latch in a center of the design area, wherein the central latch presents a connection point on a first level of the design area for receiving the control signal;

program instructions to, responsive to determining that a sub-unit of the plurality of sub-units does not include a latch, create a horizontal axis and a vertical axis through the central latch, wherein the horizontal axis and the vertical axis are bound by a perimeter of the design area; and program instructions to place a first set of latches for tiles created by the horizontal axis and the vertical axis on a second level of the design area, wherein each latch of the first set of latches is placed in a center of a single tile.

16. The computer system of claim 15, further comprising program instructions, stored on the one or more computer readable storage media, which when executed by a processor, cause the processor to:

subsequent to placement of the first set of latches, determine whether each sub-unit of the plurality of sub-units includes a latch;

responsive to determining that each sub-unit of the plurality of sub-units includes a latch, identify an unnecessary latch in the design area, wherein the unnecessary latch is selected from a group comprising of: a latch outside the bounds of the design area or a duplicate latch of a sub-unit from the plurality of sub-units.

17. The computer system claim 16, further comprising program instructions, stored on the one or more computer readable storage media, which when executed by a processor, cause the processor to:

remove the unnecessary latch from the design area; and relocate a first latch out of the first set of latches, wherein relocating the first latch decreases a border crossing amount between the plurality of sub-units.

18. The computer system of claim 17, further comprising program instructions, stored on the one or more computer readable storage media, which when executed by a processor, cause the processor to:

create a tree map for the central latch and the first set of latches, wherein the tree map is an electrical connection between each latch of the first set of latches of the second level and the central latch of the first level.

19. The computer system of claim 16, further comprising program instructions, stored on the one or more computer readable storage media, which when executed by a processor, cause the processor to:

remove the unnecessary latch from the design area; and relocate a first latch out of the first set of latches, wherein relocating the first latch decreases a rectilinear distance between the first latch and the central latch.

20. The computer system of claim 19, further comprising program instructions, stored on the one or more computer readable storage media, which when executed by a processor, cause the processor to:

create a tree map for the central latch and the first set of latches, wherein the tree map is an electrical connection between each latch of the first set of latches of the second level and the central latch of the first level.

\* \* \* \* \*